United States Patent [19]

Kumamaru et al.

[11] 4,379,726
[45] Apr. 12, 1983

[54] METHOD OF MANUFACTURING SEMICONDUCTOR DEVICE UTILIZING OUTDIFFUSION AND EPITAXIAL DEPOSITION

[75] Inventors: Kuniaki Kumamaru, Chigasaki; Shunichi Hiraki, Yokohama; Toshio Yonezawa, Yokosuka, all of Japan

[73] Assignee: Tokyo Shibaura Denki Kabushiki Kaisha, Kawasaki, Japan

[21] Appl. No.: 147,334

[22] Filed: May 6, 1980

[30] Foreign Application Priority Data

May 17, 1979 [JP] Japan .................. 54-60673

[51] Int. Cl.³ ............ H01L 21/74; H01L 21/76
[52] U.S. Cl. ............ 148/175; 29/576 E; 29/576 W; 29/577 C; 148/187; 148/190; 148/191; 357/48; 357/89
[58] Field of Search ......... 148/175, 187, 190, 191; 29/576 E, 576 W, 577 C; 357/48, 89

[56] References Cited

U.S. PATENT DOCUMENTS

| | | | |
|---|---|---|---|
| 3,566,218 | 2/1971 | Widlar et al. | 148/186 X |
| 3,767,486 | 10/1973 | Imaizumi | 148/175 |
| 3,912,555 | 10/1975 | Tsuyuki | 148/175 |
| 4,046,605 | 9/1977 | Nelson et al. | 148/175 |
| 4,168,997 | 9/1979 | Compton | 148/191 X |
| 4,272,307 | 6/1981 | Mayrand | 148/191 X |

FOREIGN PATENT DOCUMENTS 52-26873 7/1977 Japan .

*Primary Examiner*—M. J. Andrews
*Assistant Examiner*—W. G. Saba
*Attorney, Agent, or Firm*—Finnegan, Henderson, Farabow, Garrett & Dunner

[57] ABSTRACT

A method of manufacturing a semiconductor device, which comprises the steps of forming a first high impurity concentration region of a conductivity type opposite to the conductivity type of a semiconductor substrate in the substrate along the principal surface thereof, depositing a first epitaxial layer of the same conductivity type as the substrate on the entire principal surface thereof, forming a low impurity concentration region of the opposite conductivity type to the substrate in the first epitaxial layer along a surface portion thereof corresponding to the first high impurity concentration region, forming a second high impurity concentration region of the opposite conductivity type to the substrate in the first epitaxial layer along a different surface portion thereof, forming a second epitaxial layer of the opposite conductivity type to the substrate on the first epitaxial layer, thermally treating the resultant intermediate device to cause diffusion of the impurities in the first and second high impurity concentration region into the respective first and second epitaxial layers and also causing diffusion of the impurity in the low impurity concentration region into the entire portion of the first epitaxial layer corresponding to the first high impurity concentration region, and forming an element isolation region of the same conductivity type as the substrate in the second epitaxial layer such that the element isolation region reaches the first epitaxial layer.

1 Claim, 10 Drawing Figures

METHOD OF MANUFACTURING SEMICONDUCTOR DEVICE UTILIZING OUTDIFFUSION AND EPITAXIAL DEPOSITION

BACKGROUND OF THE INVENTION

This invention relates to methods of manufacturing semiconductor devices and, more particularly, to a method of manufacturing a semiconductor device in which a high breakdown voltage semiconductor element and a low breakdown voltage semiconductor element are formed on the same semiconductor substrate.

Semiconductor devices, in which a high breakdown voltage bipolar transistor and a low breakdown voltage bipolar transistor are respectively formed within a high breakdown voltage element region and a low breakdown voltage element region, these regions being defined in a single semiconductor substrate, are in practical use. In the semiconductor device of this structure, an isolation region is provided between the high breakdown voltage and low breakdown voltage bipolar transistors.

In the prior-art method of manufacturing this semiconductor device, the isolation region is formed by diffusing an impurity from the surface of the eventual device in the last or practically last step of the manufacturing process. This means that the diffusion at this time has to be made considerably deep. Therefore, it is inevitable that the isolation region spreads laterally a considerable distance, i.e., along the surface of the device. Namely, this region occupies a considerable area, which is undesirable from the standpoint of the integration density.

In another aspect, a high impurity concentration buried layer is provided within the low breakdown voltage element region. With the prior-art device the distance between this buried layer and the collector of the low breakdown voltage bipolar transistor is comparatively large. Therefore, the collector series resistance between that collector and the buried layer is considerably high. This means that the saturation characteristic, i.e., the collector saturation voltage, of the low breakdown voltage bipolar transistor is considerably high.

SUMMARY OF THE INVENTION

An object of the invention, accordingly, is to provide a method of manufacturing a semiconductor device, with which it is possible to reduce the collector series resistance of the low breakdown voltage element for improving the saturation characteristic of that element and also reduce the superficial area of the isolation region formed between the high breakdown voltage and low breakdown voltage elements for realizing a high integration density.

According to the invention, there is provided a method of manufacturing a semiconductor device which comprises the steps of selectively forming at least one first high impurity concentration region of a conductivity type opposite to the conductivity type of a semiconductor substrate and having a desired depth in the substrate along the principal surface thereof, depositing a first epitaxial layer of the same conductivity type as the substrate on the entire principal surface of the substrate, selectively forming at least one second high impurity concentration region of the opposite conductivity type to the substrate in the first epitaxial layer along a surface portion thereof not corresponding to the first high impurity concentration region, selectively forming a low impurity concentration region of the opposite conductivity type to the substrate in the first epitaxial layer along a surface portion thereof corresponding to the first high impurity concentration region, depositing a second epitaxial layer and subsequently thermally treating the resultant system, forming an element isolation region of the same conductivity type as the first epitaxial layer in a portion of the second epitaxial layer between the first and second high impurity concentration regions such that the isolation region reaches the surface of the first epitaxial layer, and forming at least one high breakdown voltage semiconductor element in a portion of the second epitaxial layer corresponding to the first high impurity concentration region and at least one low breakdown voltage semiconductor element in a portion of the second epitaxial layer corresponding to the second high impurity concentration region.

BRIEF DESCRIPTION OF THE DRAWINGS

Other objects and features of the invention will be apparent from the following description taken in connection with the accompanying drawings, in which.

DETAILED DESCRIPTION OF THE PREFERRED EMBODIMENT

The invention will now be described in conjunction with an example thereof applied to the manufacture of a bipolar transistor device with reference to FIGS. 1 to 10.

EXAMPLE

Figure 1:
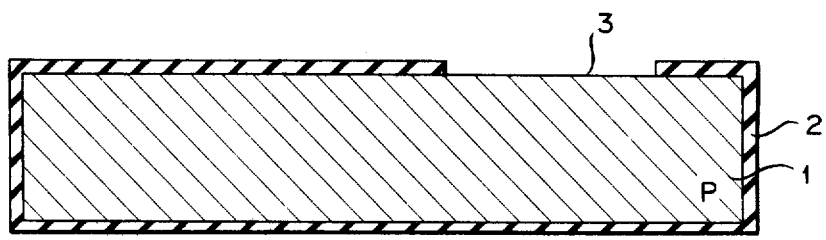
FIGS. 1 to 10 show sectional views of eventual devices at the respective steps of the method of manufacturing semiconductor devices of this invention.
Figure 2:
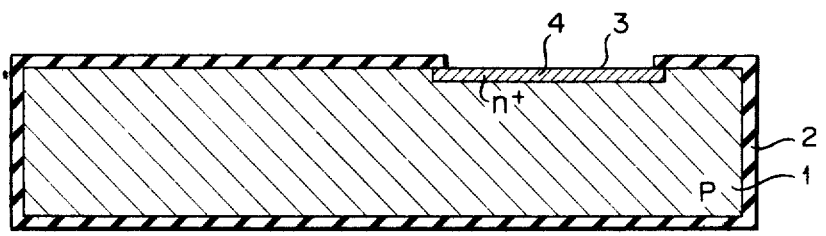

[1] As shown in FIG. 1, a thermal oxidation film 2 is formed contiguous to the entire surface of a p-type silicon substrate 1 with a resistivity of 10 Ωcm to 50 Ωcm and is selectively removed by photo-etching techniques to form a diffusion window 3 over a high breakdown voltage element forming region. Then, an impurity of the opposite conductivity type to the silicon substrate 1, i.e., n-type, (e.g., arsenic or antimony) is diffused into the substrate 1 through the diffusion window 3 to form a first n+-type impurity region 4 of a high surface impurity concentration, namely $5 \times 10^{19}/cm^3$ (as shown in FIG. 2). The depth of diffusion at this time is 5 μm.

Figure 3:
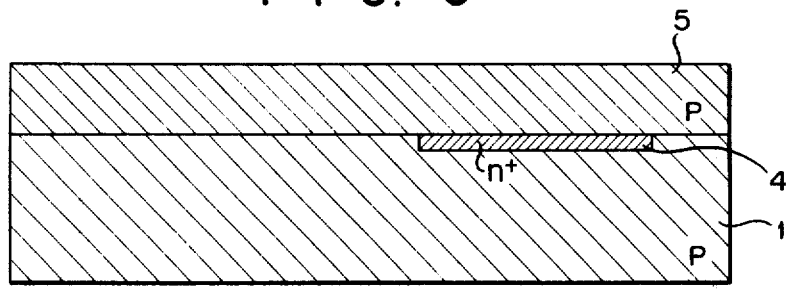

[2] Subsequently, the thermal oxidation film 2 is removed, and then boron-added silicon is epitaxially grown as a p-type epitaxial layer (first expitaxial layer) 5, of the same conductivity type as the silicon substrate 1, to a thickness of 20 μm atop the substrate 1, as shown in FIG. 3.

Figure 4:
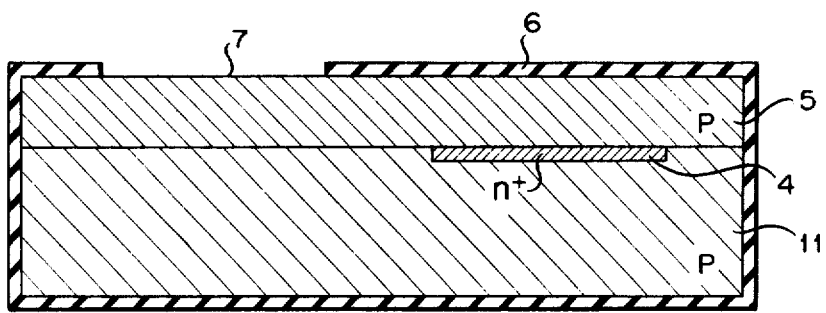
Figure 5:
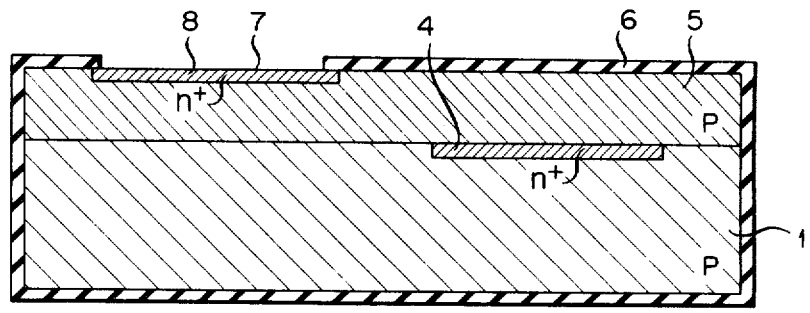

[3] Then, as shown in FIG. 4 another thermal oxidation film 6 is formed contiguous to the surface of the wafer consisting of the silicon substrate 1 and p-type epitaxial layer 5 and is selectively removed by the photo-etching techniques to form a diffusion window 7 over a low breakdown voltage element forming region other than the high breakdown voltage element forming region including the first n+-type region 4. Subsequently, an n-type impurity, of the opposite conductivity type to the substrate 1, (e.g., arsenic or antimony) is injected into the p-type epitaxial layer 5 through the diffusion window 7 to form a second n+-type impurity region 8 of a high surface impurity concentration, namely $5\times 10^{19}/cm^3$ (as shown in FIG. 5).

Figure 6:
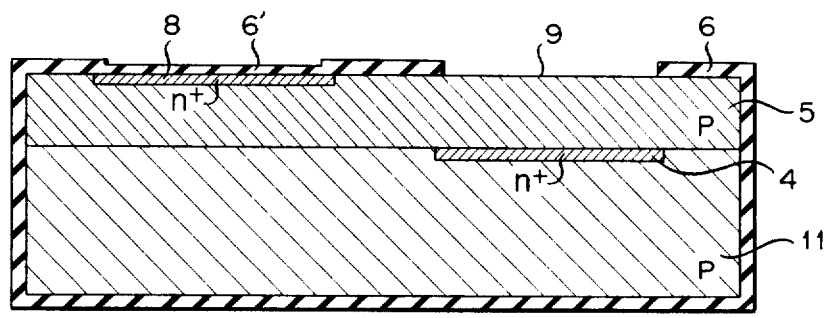
Figure 7:
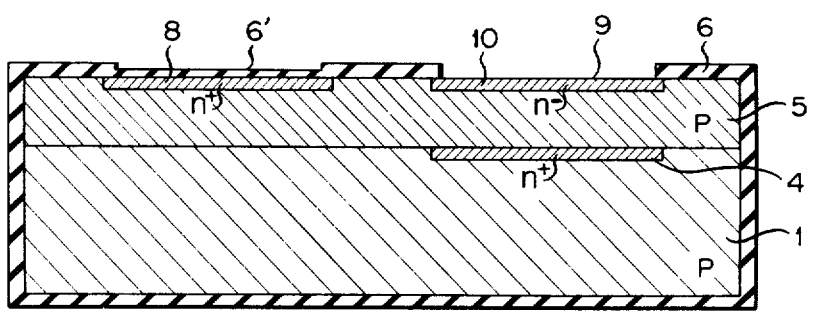

[4] Then, as shown in FIG. 6 the diffusion window 7 is closed with a thermal oxidation layer 6', and thereafter a portion of the thermal oxidation film 6 corresponding to the first n+-type impurity region 4 is photoetched to form a diffusion window 9. Subsequently, a low impurity concentration or n−-type impurity region 10 of an impurity concentration of $7\times 10^{11}/cm^2$ is formed in the p-type epitaxial layer 5 through ion injection of an n-type impurity, for instance phosphorus, through the diffusion window 9 (as shown in FIG. 7).

Figure 8:
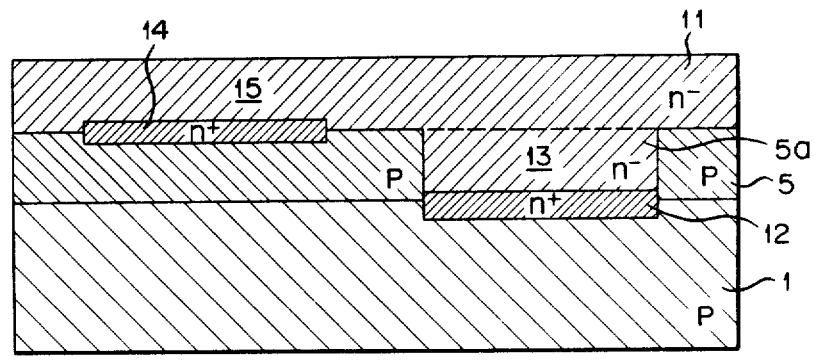

[5] Then, the thermal oxidation films 6 and 6' are removed, and arsenic-added silicon is epitaxially grown as an n−-type epitaxial layer (second epitaxial layer) 11 atop the substrate 1. Afterwards, the resultant device is thermally treated at 1,200° C. In consequence, a structure as shown in FIG. 8 is obtained. More particularly, a buried layer 12 of n+-type is formed as a result of diffusion of arsenic from the n+-type impurity region 4 in the p-type silicon substrate 1 into the epitaxial layer 5, while also a deep high breakdown voltage element region 13 which occupies a portion of the epitaxial layer 5 and a portion of the upper contiguous epitaxial layer 11 is formed as a result of the conversion of that portion of the p-type epitaxial layer 5 into an n−-type epitaxial layer 5a caused by the diffusion of phosphorus from the n−-type impurity region 10 into that portion of the p-type epitaxial layer 5. At the same time, an n+-type buried layer 14 is formed as a result of the diffusion of arsenic from the second n+-type impurity region 8 in the p-type epitaxial layer 5 into the epitaxial layer 11, while also a shallow low breakdown voltage element region 15 is formed in the upper n−-type epitaxial layer 11.

Figure 9:
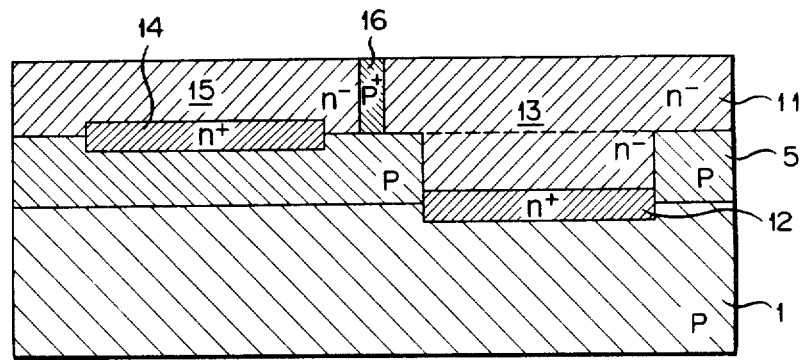

[6] Then, boron is selectively injected or diffused into a boundary portion of the n−-type epitaxial layer 11 between the high breakdown voltage element regions 13 and 15 to form a p+-type isolation region 16 (as shown in FIG. 9). The injection depth of the isolation region 16 need only cover the thickness of the second epitaxial layer, i.e., the n−-type epitaxial layer 11 which is 15 µm in thickness for the first epitaxial layer 5 is of p-type.

Figure 10:
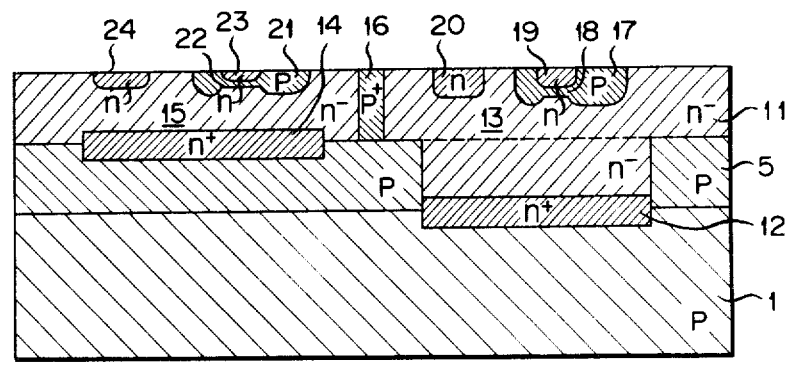

[7] Afterwards, as shown in FIG. 10, p-type outer and inner bases 17 and 18 are formed in the high breakdown voltage element region 13, and then an emitter 19 and a collector 20, which are of n-type, are formed in the inner base 18 and in a separate portion of the element region 13 respectively. In this way, a high breakdown voltage bipolar transistor is formed. Meanwhile, p-type outer and inner bases 21 and 22, an n-type emitter 23 and an n-type collector 24 are similarly formed in the low breakdown voltage element region 15 to obtain a low breakdown voltage bipolar transistor.

It has been found that the bipolar transistors which are formed in the above way respectively have high breakdown voltage and low breakdown voltage characteristics. Also, it has been found that the collector series resistance which is offered by the portion between the collector region 24 in the epitaxial layer 11 and the n+-type buried layer 14, and hence the collector saturation voltage, is sufficiently low to obtain a satisfactory saturation characteristic. This is attributable to the fact that the collector region 24 of the low breakdown voltage element and the buried layer 14 are close to each other. Further, since the injection or diffusion depth of the p+-type isolation region 16 need only cover the thickness of the second epitaxial layer (i.e., n−-type epitaxial layer 11) and is comparatively small, the isolation region 16 does not spread laterally too much. In other words, it is possible to form an isolation region occupying a narrow area of the surface of the device, so that a high density of integration can be obtained in the manufacture of a bipolar transistor device.

The surface impurity concentration of the first and second high impurity concentration regions according to the invention vary with different impurities, but usually it is preferably $1\times 10^{19}/cm^3$ to $5\times 10^{19}/cm^3$. The depth of these impurity regions may be 5 µm to 15 µm.

The impurity concentration of the first epitaxial layer according to the invention may usually be $1\times 10^{14}/cm^3$ to $5\times 10^{14}/cm^3$. The thickness of this epitaxial layer is preferably 10 µm to 20 µm.

The amount of the dosed impurities of the low impurity concentration region 10 according to the invention is preferably $7\times 10^{11}/cm^2$ to $1.2\times 10^{12}/cm^2$.

The impurity concentration of the second epitaxial layer 11 according to the invention, of the opposite conductivity type to the semiconductor substrate 1, is preferably $1\times 10^{14}/cm^3$ to $5\times 10^{14}/cm^3$. The thickness of this epitaxial layer is preferably 10 µm to 20 µm.

As has been described in the foregoing, according to the invention the saturation characteristic can be improved by reducing the collector series resistance of the low breakdown voltage element without increasing the area thereof, and also can form an element isolation region, which does not spread laterally too much and has a narrow area. Thus, it is possible to provide a method of manufacturing a semiconductor device of high reliability and high integration density.

What we claim is:

1. A method of manufacturing a semiconductor device comprising the steps of: selectively forming at least one high first impurity concentration region of a conductivity type opposite to the conductivity type of a semiconductor substrate and having a desired depth in said substrate along the principal surface thereof, depositing a first epitaxial layer of the same conductivity type as said substrate on the entire principal surface of said semiconductor substrate, selectively forming at least one second high impurity concentration region of the opposite conductivity type to said substrate in said first epitaxial layer along a surface portion thereof not corresponding to said first high impurity concentration region, selectively forming a low impurity concentration region of the opposite conductivity type to said substrate in said first epitaxial layer along a surface portion thereof corresponding to said first high impurity concentration region, the diffusion rate of the low impurity region being higher than that of the first and second high impurity concentration regions, depositing a second epitaxial layer on the entire surface of said first epitaxial layer, thermally treating the resultant intermediate device to cause diffusion of the impurities in the first and second high impurity concentration regions into the respective first and second epitaxial layers and also causing diffusion of the impurity in the low impurity concentration region into the entire portion of the first epitaxial layer corresponding to the first high impurity concentration region, forming an element isolation region of the same conductivity type as said first epitaxial layer in a portion of said second epitaxial layer between said first and second high impurity concentration regions such that said isolation layer reaches the surface of said first epitaxial layer, and forming at least one high breakdown voltage semiconductor element in said second epitaxial layer in a portion thereof corresponding to said first high impurity concentration region and at least one low breakdown voltage semiconductor element in said second epitaxial layer in a portion thereof corresponding to said second high impurity concentration region.

* * * * *